United States Patent
Tu et al.

[19]

[11] Patent Number: 6,147,005
[45] Date of Patent: Nov. 14, 2000

[54] METHOD OF FORMING DUAL DAMASCENE STRUCTURES

[75] Inventors: Yeur-Luen Tu, Taichung; Liu Yuan-Hung, Hsinchu, both of Taiwan

[73] Assignee: Worldwide Semiconductor Manufacturing Corp., Hsinchu, Taiwan

[21] Appl. No.: 09/359,414

[22] Filed: Jul. 23, 1999

[51] Int. Cl.$^7$ .................................................. H01L 21/302
[52] U.S. Cl. .............................................................. 438/706
[58] Field of Search ................................... 438/706, 723, 438/622, 523

[56] References Cited

U.S. PATENT DOCUMENTS

| | | | |
|---|---|---|---|
| 5,705,430 | 1/1998 | Avanzino et al. | 438/618 |
| 5,990,015 | 11/1999 | Lin et al. | 438/706 |
| 6,001,414 | 12/1999 | Huang et al. | 427/96 |
| 6,025,276 | 2/2000 | Donohoe | 438/734 |

*Primary Examiner*—William Powell
*Assistant Examiner*—Lynette T. Umez-Eronini

[57] ABSTRACT

A method for forming the dual damascene structure over a semiconductor substrate is disclosed in the present invention. First, a first dielectric layer is formed on the semiconductor substrate. An etch stopping layer is formed on the first dielectric layer. And a second dielectric layer is formed on the etch stopping layer. The second dielectric layer is then etched till the etch stopping layer to form a first opening and a second opening on the second dielectric layer. It is noted that the size of the second opening is bigger than that of the first opening. A polymer layer is next formed on the second dielectric layer and the etch stopping layer to close the first opening and to fill into a portion of the second opening for defining a third opening in the second opening. The polymer layer formed on the bottom of the third opening, the etch stopping layer and the first dielectric layer are etched in sequence, by using the polymer layer formed on the sidewalls of the second opening to serve as an etching mask, to expose a surface of the semiconductor substrate for defining the third opening on the first dielectric layer. After the polymer layer is removed, a conducting layer is fill into the first opening, the second opening and the third opening.

22 Claims, 7 Drawing Sheets

METHOD OF FORMING DUAL DAMASCENE STRUCTURES

FIELD OF THE INVENTION

The present invention relates to a process for manufacturing the semiconductor circuit interconnections, and more specifically, to a process for manufacturing the dual damascene structures on the semiconductor substrate.

BACKGROUND OF THE INVENTION

With the brisk advance of the semiconductor industry recently, the sizes of semiconductor devices have become smaller and smaller than before in the field of Ultra Large Scale Integrated (ULSI) technologies, in order to achieve high performance integrated circuits or high package density of a wafer. In general, the integrated circuits include more than millions devices in a specific area of a wafer and electrically connecting structure for connecting these devices to perform desired function. The performance of the integrated circuits is related to the performance and reliability of its constituent individual devices. Besides, the innumerable fine peripheral circuits are needed for the integrated circuits in order to drive or control these devices to perform their function. Each device also requires interconnections for exchanging electrical signals from one device to another device. Specifically, multi-level interconnection techniques are widely used for high-density integrated circuits with the decreasing scales of the semiconductor manufacture.

However, due to the limitation of the resolution of the lithography process, the depth of focus can not be controlled precisely and effectively. Thus, the accuracy and resolution of the defined patterns are hardly maintained. And, the procedures to deposit the metal layer and etch the films especially copper also are difficult to control. For overcoming the issues above, the damascene technique used to form the trench connection and the conductive plug on the substrate simultaneously is widely developed, in order to manufacture the multi-interconnections. As well known about the damascene technique, the plug of the damascene is used to electrically connect the substrate and the trench interconnections above the substrate. Accordingly, by widely applying the dual damascene process to the manufacture of submicron very large scale integration circuits, the reliability and yields of the integrated circuits are mainly promoted, and the ability for manufacturing the interconnections is also promoted.

It is noted that two photo masks are usually needed in the process of manufacturing damascene structure for defining respectively the trench pattern and the contact hole pattern onto the substrate. However, with the continuous increasing integration and the decreasing scales of the various devices, the sizes of the dual damascene structures are similarly shrinking. Thus, when the two photomasks are used in the process for forming the damascene structures, the slight inaccuracies cause the misalign between the trench pattern and the contact hole pattern. And the yields and performance of the produced dual damascene are principally decreased. Namely, the resistance between the trench connection and the plug formed in latter steps is increased, and the conductive efficiency among the interconnections is lower.

Besides, in the conventional art, usually the photoresist is formed into the trench structures after defining the trench patterns, in order to prevent the trench structures suffering from etching damage in performing the step to define the contact/via hole pattern. However, that the depth of focus can not be controlled precisely in defining the photoresist pattern causes difficulty to control the contact/via hole pattern especially as their size becomes smaller and smaller. The yields and the efficiency of the dual damascene structures are reduced.

SUMMARY OF THE INVENTION

The prime objective of the present invention is to manufacture the dual damascene structures on the substrate.

The another objective of the present invention is to form the trench connections and the conductive plugs simultaneously on the substrate.

The further objective of the present invention is to form the dual damascene structures by using a polymer layer to serve as the etching mask for closing the trench structures and for defining the contact hole patterns.

A method of forming the dual damascene structure over a semiconductor substrate is disclosed hereinafter. First, a first dielectric layer is formed on the semiconductor substrate. A second dielectric layer is formed on the first dielectric layer. And the second dielectric layer is etched till the first dielectric layer to form a trench and an opening on the second dielectric layer. It is noted that the size of the opening is bigger than that of the trench. Then, a polymer layer is formed on the second dielectric layer, the first dielectric layer, bottom and sidewalls of the trench, and bottom and sidewalls of the opening. The polymer layer formed on the upper portions of the sidewalls of the trench has overhang structures for closing the trench. The polymer layer formed on the bottom and sidewalls of the opening is used to define a contact hole pattern. The polymer layer formed on the bottom of the contact hole pattern is next removed for exposing a portion of the first dielectric layer. The first dielectric layer is etched to expose a surface of the semiconductor substrate for transferring the contact hole pattern onto the first dielectric layer. After the polymer layer is removed, a conducting layer is filled into the trench, the opening and the contact hole.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed to manufacture the dual damascene structure above the semiconductor substrate to serve as the interconnections of the integrated circuits. By adjusting the etching recipe in the step of etching the second dielectric layer for defining the trench pattern and the opening on the second dielectric layer, the in-situ polymer layer is formed on the semiconductor substrate. It is noted that the polymer layer is used to close the trench and to define the contact/via hole in the opening. The polymer layer is also used to serve as an etching mask for defining the contact/via hole pattern on the first dielectric layer. A conducting layer is next formed to fill into the trench, opening and contact/via hole for forming the dual damascene structure.

Figure 1:
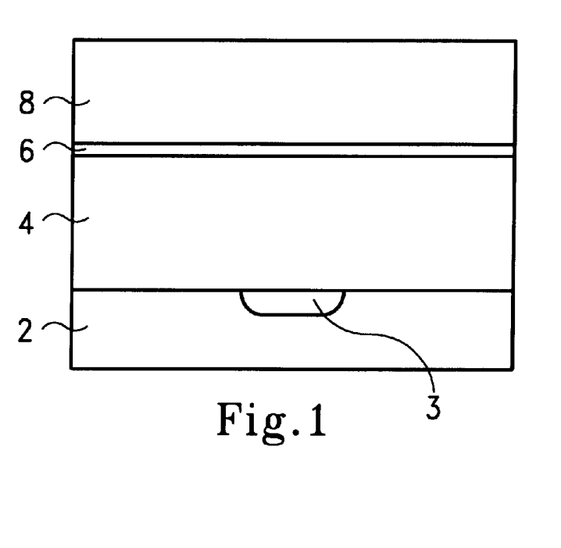
FIG. 1 is a cross sectional view of a semiconductor wafer illustrating the steps of forming the first dielectric layer, etch stopping layer and the second dielectric layer in accordance with the present invention.

Referring to FIG. 1, in the preferred embodiment, a silicon wafer is provided with <100> crystallographic orientation to serve as a semiconductor substrate 2. A device (not shown) is manufactured in the substrate 2. The device has an active area 3, such as drain, source, etc., formed on the substrate. Then, the first dielectric layer 4 is formed on the semiconductor substrate 2. An etch stopping layer 6 is formed on the first dielectric layer 4. And the second dielectric layer 8 is formed on the etch stopping layer 6. In a preferred embodiment, both the first dielectric layer 4 and the second dielectric layer 8 are formed of silicon oxide layer, and the etch stopping layer 6 is formed of silicon nitride layer. Typically, the silicon oxide layers used to serve as the first dielectric layer 4 and the second dielectric layer 8 are formed by using chemical vapor deposition (CVD) process, using TEOS as a source at a temperature between about 600 to 800° C., at a pressure 0.1 to 1 torrs. The silicon nitride is formed at 400 to 450° C., and the reaction gases to form the silicon nitride layer are $SiH_4$, $NH_3$, and $N_2O$. Preferably, the first dielectric layer 4 has a thickness about 4000 to 10000 angstroms and the second dielectric layer 8 has a thickness about 3000 to 5000 angstroms. The etch stopping layer has a thickness about 250 to 1000 angstroms. It is noted that the etch stopping layer 6 is optional due to the etching stoppage can be adjusted by controlling the etching time.

Figure 2:
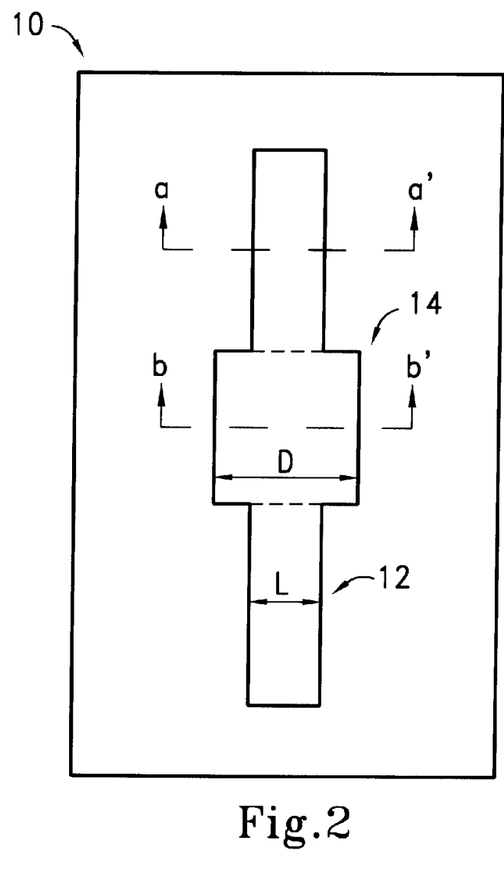
FIG. 2 is a top view of the photomask having a trench pattern and a contact hole pattern in accordance with the present invention.

Please refer to FIG. 2, the photomask 10 used to define patterns onto the substrate 2 in the present invention is illustrated. The photomask 10 has a trench pattern 12 and an opening pattern 14 formed thereon. And the opening pattern 12 is overlapped on the trench pattern 10. It is noted that the width D of the opening pattern 14 is bigger than the width L of the trench pattern 12 due to the opening pattern 14 is used to define the contact hole pattern in latter steps. In a preferred embodiment, the width L of the trench pattern 12 is about 0.2 to 0.5 $\mu$m.

Figure 3A:
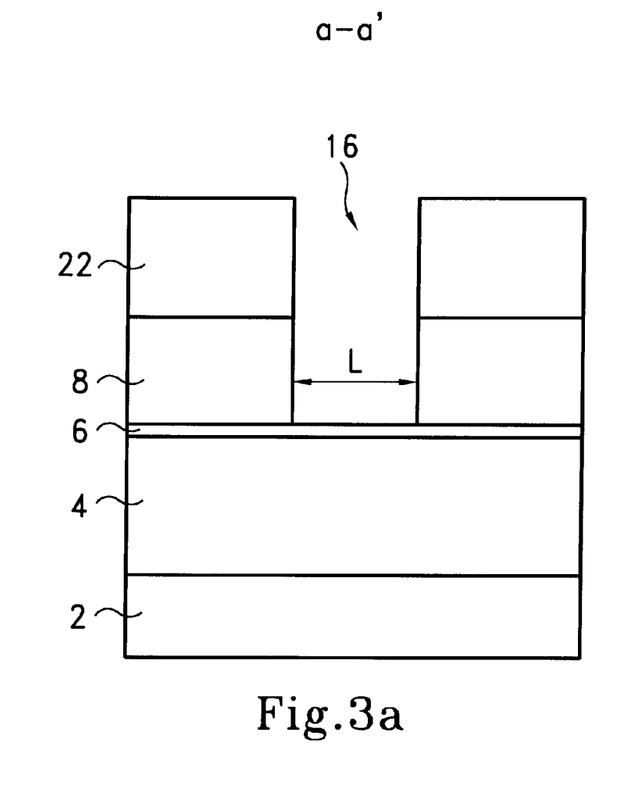
FIGS. 3A, B are the cross sectional views of a semiconductor wafer illustrating the steps of forming the trench pattern and the opening pattern onto the wafer in accordance with the present invention.
Figure 3B:
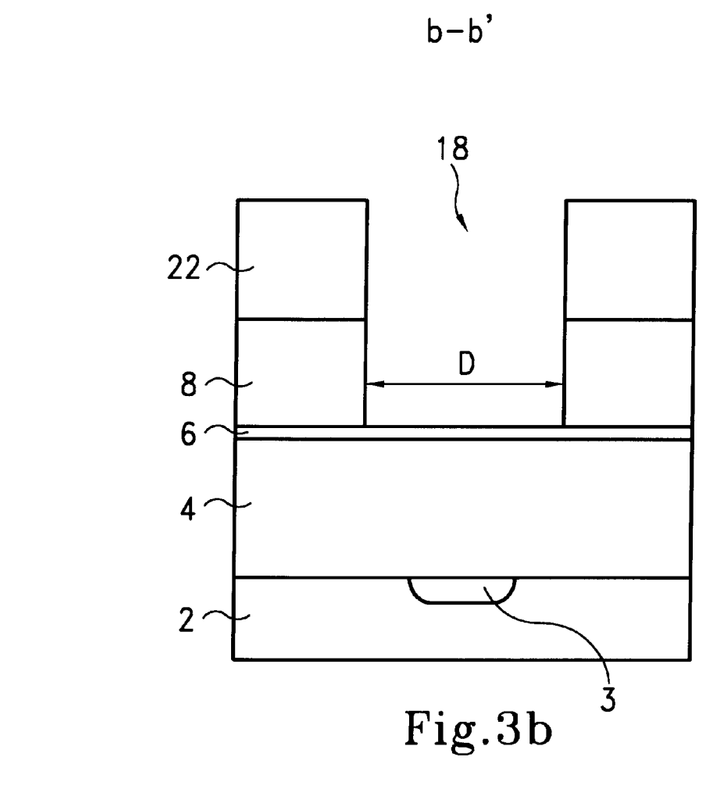

Then, referring to FIGS. 3A, B, the FIG. 3A illustrates the sectional view of the substrate 2 along the line a–a', and the FIG. 3B illustrates the sectional view of the substrate 2 along the line b–b'. Similarly, FIGS. 4A~8A all depict the sectional views of the substrate 2 along the line a–a', and FIGS. 4B~8B all depict the sectional views of the substrate 2 along the line b–b'. First, a photoresist layer 22 is formed on the top surface of the second dielectric layer 8. Then, a photolithography procedure is performed to transfer the patterns of the photomask 10 onto the substrate 2. After the photoresist 22 is defined by using the photomask 10, the second dielectric layer 8 is etched by using the photoresist layer 22 as an etching mask till the etch stopping layer 6. The trench 16 and the opening 18, as shown in FIGS. 3A, B, are formed onto the second dielectric layer 8, and portions of the etch stopping layer are exposed. As described above, the trench 16 has the width L and the opening 18 has the width D. And the width D of the opening 18 is bigger than the width L. In general, the anisotropically etching process such as the reactive ion etching process is used to etch the second dielectric layer 8. The etchant used to etch the silicon oxide layer can be chosen from $CH_2F_2$, $CHF_3/CF_4$, $CHF_3/O_2$, $C_4H_8/O_2$, and $CF_4/O_2$.

Figure 4A:
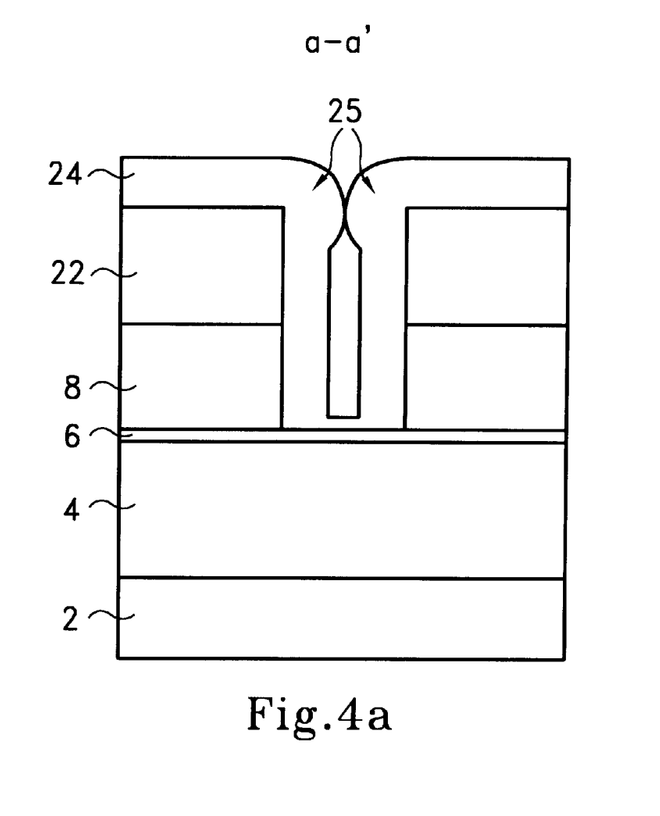
FIGS. 4A, B are the cross sectional views of a semiconductor wafer illustrating the steps of forming the polymer layer into the partial trench pattern and the partial opening pattern in accordance with the present invention.
Figure 4B:
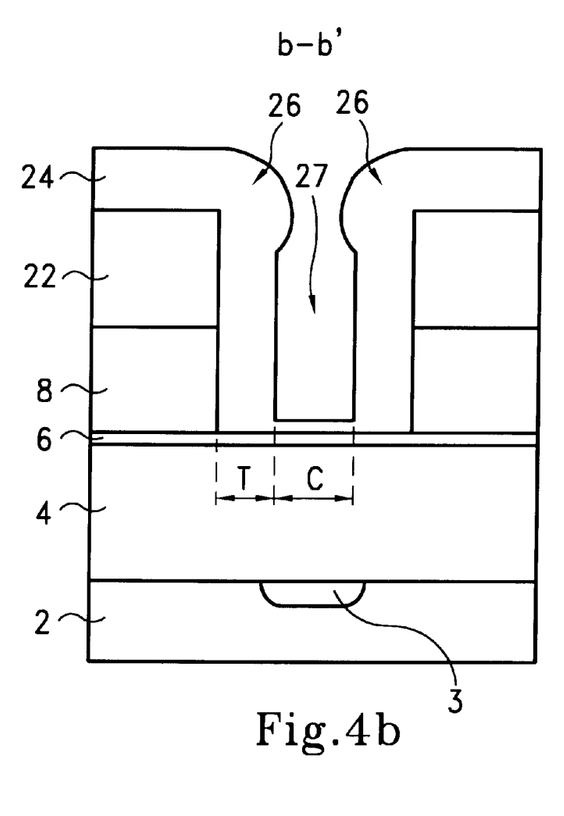

Then, as shown in FIGS. 4A, 4B, a polymer layer 24 is formed along the surface of the substrate 2 on the second dielectric layer 8, the photoresist layer 22 and the etch stopping layer 6. Namely, the polymer layer 24 is formed on the bottom and sidewalls of the trench 16 and formed on the bottom and sidewalls of the opening 18. It is noted that the polymer layer 24 formed on the upper portions of the sidewalls of the trench 16 has overhang structures 25. And the two overhang structures 25 located on the sidewalls of the trench 16 respectively can contact each other to close the trench 16, as shown in FIG. 4A. The polymer layer 24 formed on the upper portions of the sidewalls of the opening 18 also has the overhang structures 26, but the overhang structures 26 will not contact each other and close the opening 18 due to the width of the opening 18 is bigger than that of the trench 16. Relatively, the polymer layer 24 formed in the partial opening 18 can be used to define the contact/via hole pattern 27 in the opening 18.

In general, the polymer layer 24 above the substrate 2 can be formed by adjusting the etching recipe of the step to etch the second dielectric layer 8. As well known, the etching rate and efficiency are promoted by increasing the fluorine atoms. Relatively, much more polymer layer is formed in the etching procedure by increasing the carbon atoms. Thus, the polymer layer 24 as shown in FIGS. 4A, 4B is deposited by adjusting the ratio of carbon to fluorine. In a preferred embodiment, the polymer layer 24 can be formed by adjusting the ratio of $C_4F_8$/CO, wherein the reactive gas $C_4F_8$ is about 6 to 8 sccm, the CO is about 360 to 480 sccm, and the bias power is about 400 to 800 Watts, the temperature is about 0~20° C. Thus, the polymer layer 24 has a depositing rate about 400 to 800 angstroms/min.

It is noted that the property of the polymer layer 24 by adjusting the etching recipe in the step of etching the second dielectric layer 8 is similar to the film deposited by using the Plasma Enhanced Chemical Vapor Depostition (PECVD) process. Namely, the step coverage ability of the polymer layer 24 is not ideal. Thus, the polymer layer formed on the bottom of the trench 16 has a thickness about 20~30% of that of the polymer layer formed on the photoresist 22, as illustrated in FIG. 4A. As the same, the thickness of the polymer layer formed on the bottom of the opening 18 is only about 20~30% of that of the polymer layer formed on the photoresist layer 22, as shown in FIG. 4B.

Besides, similar to the film formed by using the PECVD process, the polymer layer 24 formed on the upper portions of the sidewalls of the trench 16 and the opening 18 both have the overhang structures 25, 26 due to the polymer is intended to deposited thereon. Thus, the thickness of the polymer layer 24 formed on the upper portions of the sidewalls of the trench 16 and the opening 18 can be adjusted by controlling the period of depositing the polymer layer, in order to form the overhang structures 25,26 that can contact each other and can be used to close the trench 16 (as illustrated in FIG. 4A). And the thickness T of the polymer layer 24 is controlled to conform the equation 2T>L, wherein the L is indicated the width of the trench 16, for confirming that the overhang structures 25 can contact each other to close the trench. Similarly, the width C of the contact/via hole 27 in the opening 18 is adjusted to conform the equation C+2T=D. Namely, the width D of the opening 18 can be determined by controlling the width C of the contact/via hole 27 and the thickness T of the polymer layer 24. And the photomask 10 needed in the present invention can be manufactured based on the equations above. In a preferred embodiment, the width C of the contact hole 27 is about 0.25 to 0.4 μm, and the thickness T of the polymer layer 26 is about 1000 to 2500 angstroms.

Figure 5A:
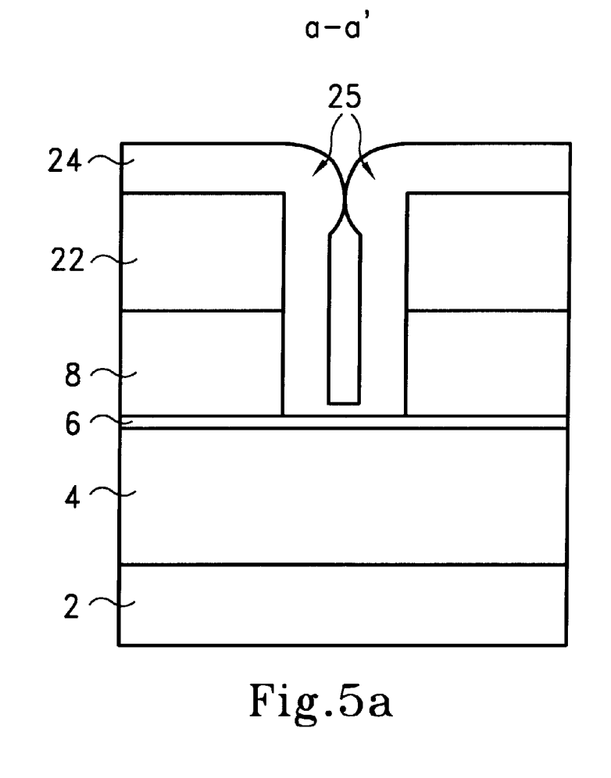
FIGS. 5A, B are the cross sectional views of a semiconductor wafer illustrating the steps of removing the exposed etch stopping layer in accordance with the present invention.
Figure 5B:
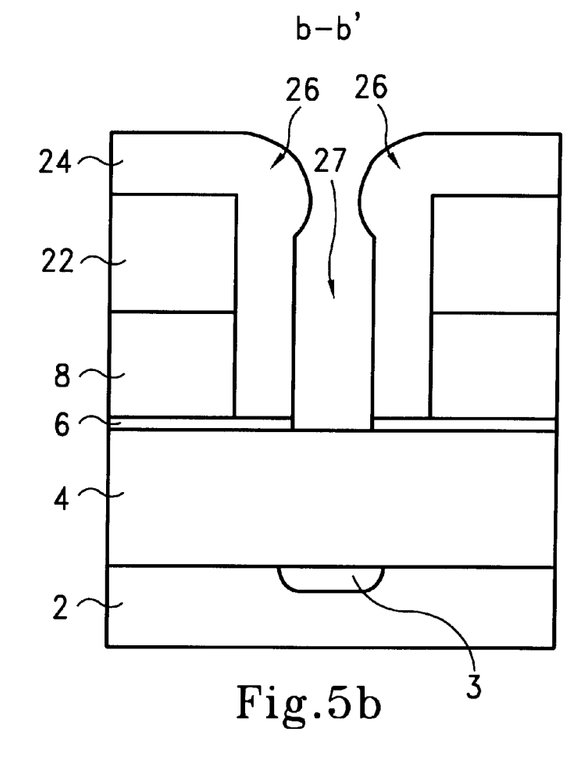

Then, referring to FIGS. 5A, B, the polymer layer 24 formed on the sidewalls of the opening 18 is used to serve as an etching mask for removing the partial polymer layer 24 formed on the bottom of the contact hole 27, and for removing the exposed etch stopping layer 6 to expose a portion of the first dielectric layer 4. The etching step will not cause the severe damage for the polymer layer 24 formed on the top surface of the photoresist layer 22 due to the thickness of the polymer layer formed on the bottom of the contact hole 27 is about 20~30% of that of the polymer layer formed on the photoresist layer 22. In addition, though the thickness of the polymer layer 24 formed on the bottom of the trench 16 is small too, the overhang structures 25 can be used to close the trench 16 for protecting the polymer layer on the bottom of the trench 16 in the etching step. The etchant used to remove the silicon nitride layer can be chosen from $CF_4/H_2$, $CHF_3$, and $CH_2F_2$.

Figure 6A:
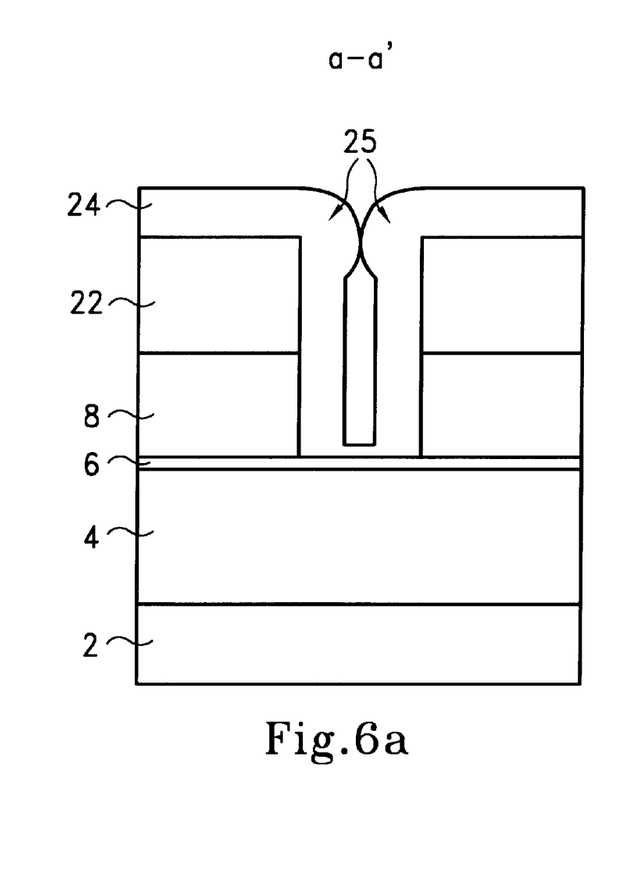
FIGS. 6A, B are the cross sectional views of a semiconductor wafer illustrating the steps of defining the contact hole pattern onto the first dielectric layer by using the polymer layer to serve as the etching mask in accordance with the present invention.
Figure 6B:
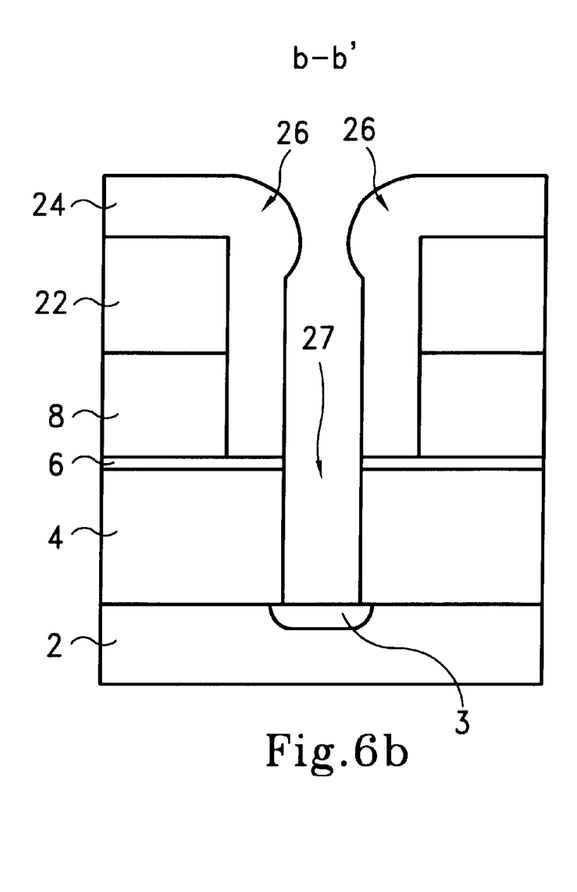

Then, as illustrated in FIG. 6B, the polymer layer 24 is used to serve as the etching mask for etching the first dielectric layer 4 to define the contact hole pattern 27 onto the first dielectric layer 4 and to expose the top surface of the substrate 2. In a preferred embodiment, an anisotropically etching procedure such as reaction ion etching method (RIE) is performed to etch the first dielectric layer 4. The etchant to remove oxide is selected from the group of $CH_2F_2/C_4F_8/CO$ and $C_4F_8/CO$ to reach a high oxide to nitride selectivity. It is noted that the etch stopping layer 6, the first dielectric layer 4 beneath the bottom of trench 16 will not be etched in the step of etching the first dielectric layer 4 due to the closing effect by the polymer layer 24, as depicted in FIG. 6A.

Figure 7A:
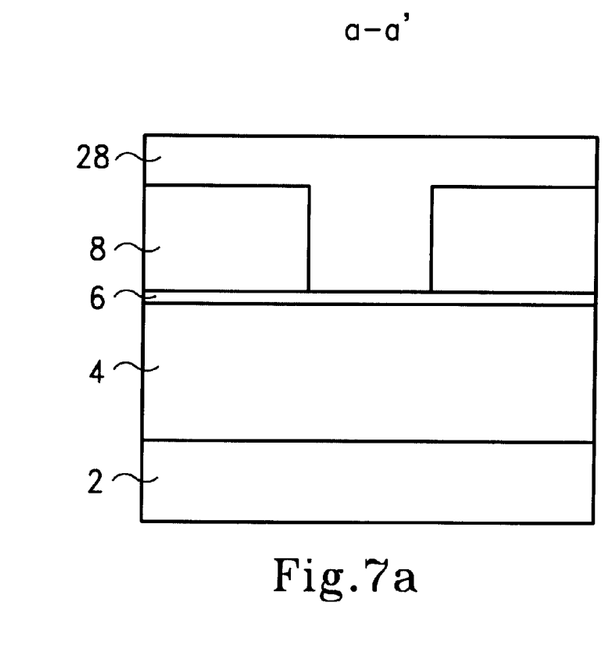
FIGS. 7A, B are the cross sectional views of a semiconductor wafer illustrating the steps of filling the conductive layer into the trench, the opening and the contact hole in accordance with the present invention.
Figure 7B:
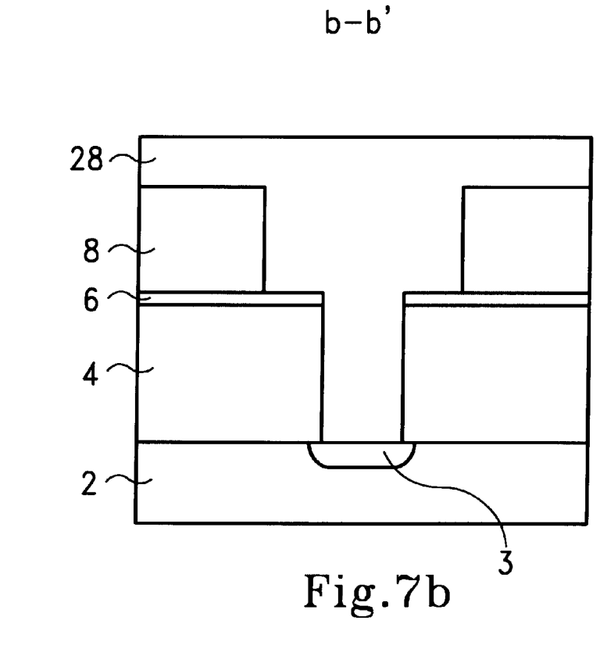

After the contact hole 27 is formed on the first dielectric layer 4, the polymer layer 24 on the substrate 2 is removed, and the photoresist layer 22 on the second dielectric layer 8 is removed too. Typically, a wet etching step is performed to remove the polymer layer 24 and the photoresist layer 22 on the substrate 2. Then, a conducting layer 28 is formed to cover the second dielectric layer 8 and to fill into the trench 16, the opening 18, and the contact hole 27, as shown in FIGS. 7A, 7B. In general, the conducting layer 28 can be formed by using the well known processes, such as the physically vapor deposition process (PVD), sputtering method, etc., to form the aluminum layer on the substrate 2. Besides, other materials such as doped polysilicon, in-situ doped polysilicon, aluminum, copper, tungsten, platinum, titanium, or any combinations thereon, can be used to form the conducting layer 28.

Figure 8A:
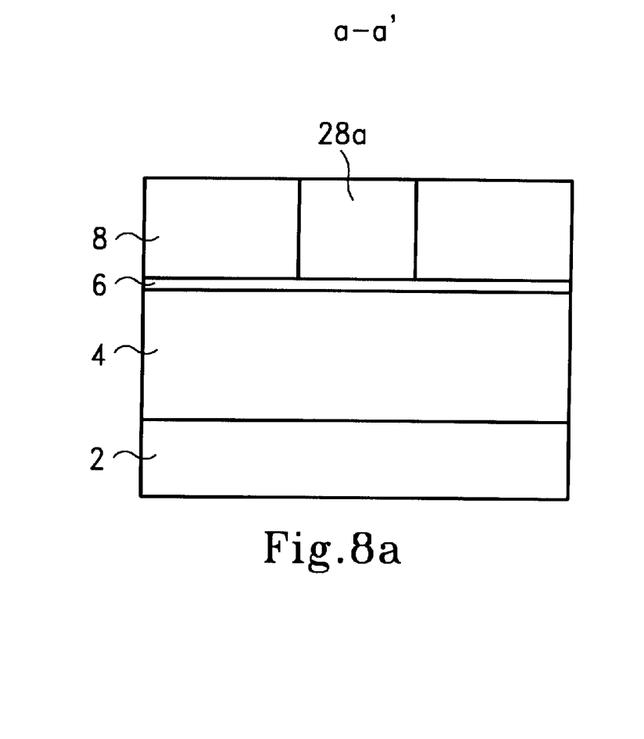
FIGS. 8A, B are the cross sectional views of a semiconductor wafer illustrating the steps of performing a chemically mechanic polishing procedure to remove the conductive layer on the second dielectric layer in accordance with the present invention.
Figure 8B:
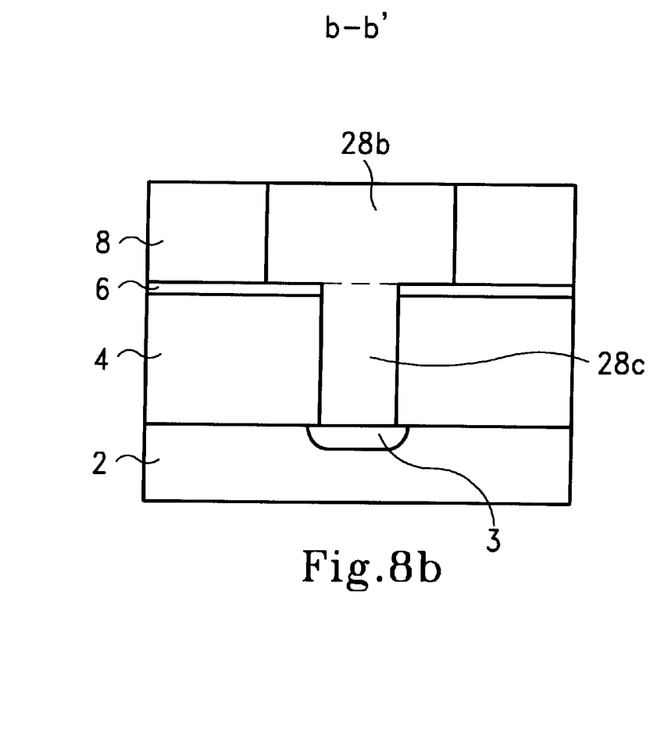

Then, referring to FIGS. 8A, 8B, a Chemically Mechanical Polishing method (CMP) is performed to remove the conducting layer 28 above the second dielectric layer 8 for forming the dual damascene structure. As shown in FIG. 8A, the needed connection structure 28a is formed in the trench 16 on the second dielectric layer 8. And as shown in FIG. 8B, the connection structure 28b is formed in the opening 18 and the conducting plug 28c is formed in the contact hole, wherein the conducting plug 28c is connected to the active area 3 on the substrate 2.

The present invention can provide various benefits over the prior art. First, one photomask process can be saved by using the method proposed in the present invention. The in-situ polymer layer formed on the substrate by adjusting the etching recipe of the etching step can be used to serve as the etching mask for closing the trench, and used to define the contact hole pattern. Thus, only the defined contact hole pattern can be transferred onto the first dielectric layer in latter etching step. Compared to the prior art, the process proposed by the present invention does not require an extra photomask for defining the contact hole pattern. Besides, the self-aligned contact hole can be formed due to the etching mask is formed of the polymer layer deposited in the opening. Thus, the misalign problems occurring in the conventional technique due to using two photomasks to define the trench and contact hole respectively can be overcome effectively. Except the costs to manufactrue the dual damascene structures are lowered, the cycle time is also decreased because the photomask sum is reduced. And the yield and the performance of the product are both promoted effectively.

As is understood by a person skilled in the art, the foregoing preferred embodiment of the present invention is illustrated of the present invention rather than limiting of the present invention. For example, the etch stopping layer is used to identify the etching end point in the present invention. However, for the man who is skilled in the art, it is apparent to identify the etching end by controlling the etching period too. It is thus intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming the dual damascene structure over a semiconductor substrate, said method comprises the following steps of:

forming a first dielectric layer on said semiconductor substrate;

forming an etch stopping layer on said first dielectric layer;

forming a second dielectric layer on said etch stopping layer;

etching said second dielectric layer till said etch stopping layer to form a first opening and a second opening on said second dielectric layer, wherein a size of said second opening is bigger than that of said first opening;

forming a polymer layer on said second dielectric layer and said etch stopping layer for closing said first opening and filling into a portion of said second opening to define a third opening in said second opening;

etching said polymer layer formed on the bottom of said third opening, said etch stopping layer and said first dielectric layer to expose a surface of said semiconductor substrate for defining said third opening on said first dielectric layer by using said polymer layer formed on the sidewalls of said second opening to serve as an etching mask;

removing said polymer layer; and forming a conducting layer to fill into said first opening, said second opening and said third opening.

2. The method of claim 1, wherein said first dielectric layer is formed of a silicon oxide layer with a thickness about 4000 to 10000 angstroms.

3. The method of claim 1, wherein said second dielectric layer is formed of a silicon oxide layer with a thickness about 3000 to 5000 angstroms.

4. The method of claim 1, wherein said etch stopping layer is formed of a silicon nitride layer with a thickness about 250 to 1000 angstroms.

5. The method of claim 1, wherein said first opening has a size about 0.2 to 0.5 $\mu$m.

6. The method of claim 1, wherein said polymer layer formed on the upper portions of sidewalls of said first opening has overhang structures, and said overhang structures contact each other for closing said first opening.

7. The method of claim 1, wherein said first opening is used to define a trench.

8. The method of claim 1, wherein said third opening is used to define a contact hole.

9. The method of claim 1, wherein said polymer layer is formed by adjusting the etching recipe of said step to etching said second dielectric layer.

10. The method of claim 9, wherein the etching recipe used to form said polymer layer comprises of $C_4F_8$ about 6 to 8 sccm, CO about 360 to 480 sccm, bias power about 400 to 800 watts and a temperature about 0 to 20° C.

11. The method of claim 1, wherein said polymer has a thickness T and said first opening has a size L, and 2T>L.

12. The method of claim 1, wherein said third opening has a size about 0.25 to 0.4 $\mu$m.

13. The method of claim 1, wherein said polymer layer has a thickness about 1000 to 2500 angstroms.

14. A method of forming the dual damascene structure over a semiconductor substrate, said method comprises the following steps of:

forming a first dielectric layer on said semiconductor substrate;

forming a second dielectric layer on said first dielectric layer;

etching said second dielectric layer till said first dielectric layer to form a trench and an opening on said second dielectric layer, wherein a size of said opening is bigger than that of said trench;

forming a polymer layer on said second dielectric layer, said first dielectric layer, a bottom and sidewalls of said trench, and a bottom and sidewalls of said opening, wherein said polymer layer formed on the upper portions of the sidewalls of said trench has overhang structures for closing said trench, and said polymer layer formed on said bottom and sidewalls of said opening is used to define a contact hole pattern;

removing said polymer layer formed on said bottom of said contact hole pattern to expose a portion of said first dielectric layer;

etching said first dielectric layer to expose a surface of said semiconductor substrate for transferring said contact hole pattern onto said first dielectric layer by using said polymer layer formed on said sidewalls of said opening to serve as an etching mask;

removing said polymer layer; and forming a conducting layer to fill into said trench, said opening and said contact hole.

15. The method of claim 14, wherein said first dielectric layer is formed of a silicon oxide layer with a thickness about 4000 to 10000 angstroms.

16. The method of claim 14, wherein said second dielectric layer is formed of a silicon oxide layer with a thickness about 3000 to 5000 angstroms.

17. The method of claim 14, wherein a silicon nitride layer with a thickness about 250 to 1000 angstroms is formed on said first dielectric layer before forming said second dielectric layer to serve as an etch stopping layer.

18. The method of claim 14, wherein said trench has a size about 0.2 to 0.5 $\mu$m.

19. The method of claim 14, wherein the recipe used to form said polymer layer comprises of $C_4F_8$ about 6 to 8 sccm; CO about 360 to 480 sccm; bias power about 400 to 800 watts; and a temperature about 0 to 20° C.

20. The method of claim 14, wherein said polymer has a thickness T and said first opening has a size L, and 2T>L.

21. The method of claim 14, wherein said contact hole has a size about 0.25 to 0.4 $\mu$m.

22. The method of claim 14, wherein said polymer layer has a thickness about 1000 to 2500 angstroms.

* * * * *